(12) United States Patent
Ting et al.

(10) Patent No.: US 11,450,785 B2
(45) Date of Patent: Sep. 20, 2022

(54) TRANSFER CARRIER FOR MICRO LIGHT-EMITTING ELEMENT

(71) Applicant: PLAYNITRIDE INC., Zhubei (TW)

(72) Inventors: Tzu-Yu Ting, Zhubei (TW); Sheng-Chieh Liang, Zhubei (TW); Yu-Hung Lai, Zhubei (TW)

(73) Assignee: PlayNitride Inc., Hsinchu County (TW)

( * ) Notice: Subject to any disclaimer, the term of this patent is extended or adjusted under 35 U.S.C. 154(b) by 0 days.

(21) Appl. No.: 17/157,737

(22) Filed: Jan. 25, 2021

(65) Prior Publication Data

US 2021/0151622 A1 May 20, 2021

Related U.S. Application Data

(63) Continuation of application No. 16/000,418, filed on Jun. 5, 2018, now Pat. No. 10,991,846.

(30) Foreign Application Priority Data

Sep. 13, 2017 (TW) ................................ 106131483

(51) Int. Cl.
*H01L 27/15* (2006.01)
*H01L 33/00* (2010.01)
*H01L 23/00* (2006.01)
*H01L 25/00* (2006.01)
(Continued)

(52) U.S. Cl.
CPC ........ *H01L 33/005* (2013.01); *H01L 21/6835* (2013.01); *H01L 24/03* (2013.01); *H01L 24/11* (2013.01); *H01L 24/81* (2013.01); *H01L 24/95* (2013.01); *H01L 25/50* (2013.01); *H01L 33/0093* (2020.05); *H01L 24/13* (2013.01); *H01L 25/0753* (2013.01); *H01L 27/156* (2013.01); *H01L 2221/68354* (2013.01); *H01L 2221/68368* (2013.01); *H01L 2224/11001* (2013.01); *H01L 2224/11422* (2013.01); *H01L 2224/13082* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13166* (2013.01); *H01L 2224/81005* (2013.01); *H01L 2224/81193* (2013.01);
(Continued)

(58) Field of Classification Search
CPC ....... H01L 33/005; H01L 24/03; H01L 25/50; H01L 25/0753; H01L 27/156; H01L 2224/81005; H01L 2224/13166; H01L 2224/13169; H01L 2224/13144; H01L 2224/13124; H01L 2224/13113; H01L 2224/13171
See application file for complete search history.

(56) References Cited

U.S. PATENT DOCUMENTS

2009/0137082 A1* 5/2009 Kurita ................. H01L 25/0657 228/141.1
2015/0155439 A1* 6/2015 Cich ....................... H01L 33/16 362/296.09
2015/0287696 A1* 10/2015 Ueda ...................... H01L 24/32 438/107

\* cited by examiner

*Primary Examiner* — Shih Tsun A Chou
(74) *Attorney, Agent, or Firm* — JCIPRNET

(57) ABSTRACT

A transfer carrier is adapted to be connected to an electrode of a micro light-emitting element and transfer the micro light-emitting element. A transfer carrier includes a transfer substrate and a plurality of metal bonding pads. The metal bonding pads are disposed on the transfer substrate, and every two metal bonding pads that are adjacent to each other are spaced apart from each other through a gap.

6 Claims, 12 Drawing Sheets

(51) Int. Cl.
  *H01L 21/683* (2006.01)
  *H01L 25/075* (2006.01)
(52) U.S. Cl.
  CPC ............... *H01L 2224/81815* (2013.01); *H01L 2224/95* (2013.01); *H01L 2924/12041* (2013.01)

TRANSFER CARRIER FOR MICRO LIGHT-EMITTING ELEMENT

CROSS-REFERENCE TO RELATED APPLICATIONS

This non-provisional application is a continuation patent application of U.S. application Ser. No. 16/000,418 filed in Jun. 5, 2018, which claims priority under 35 U.S.C. § 119(a) on Patent Application No(s). 106131483 filed in Taiwan, R.O.C. on Sep. 13, 2017, the entire contents of which are hereby incorporated by reference.

TECHNICAL FIELD

The disclosure relates to a method of manufacturing a micro light-emitting element array, a transfer carrier and a micro light-emitting element array, more particularly to a micro light-emitting element array, a transfer carrier and a micro light-emitting element array which are configured to simultaneously transfer the micro light-emitting element and dispose a first conductive bump.

BACKGROUND

The light emitting diode (LED) is widely used in many fields as a light emitting element with high luminous efficiency. The conventional method of manufacturing the LED is the epitaxial method. An N-type semiconductor layer, a light emitting layer, and a P-type semiconductor layer are formed on a substrate in sequence so as to obtain the LED.

When the size of the LED is reduced in micrometer scale, the LED is formed as a micro light-emitting element for a display device. In detail, a plurality of micro light emitting elements are arranged on a panel of the display device in an array arrangement so as to form a micro light-emitting element array used to be a light source of the display device which is known as the micro-LED display device. In the conventional method of manufacturing the display device, in order to transfer the micro light-emitting element array from an epitaxial substrate to the transfer substrate and then transfer the micro light-emitting element array from the transfer substrate to the panel, it is required to repeatedly attach bonding materials on the micro light-emitting element array, the transfer substrate and the panel.

SUMMARY

According to an embodiment of the present disclosure, a method of manufacturing micro light-emitting element array includes: providing a transfer substrate and at least one metal bonding pad, the metal bonding pad is disposed on the transfer substrate; providing a growth substrate and a plurality of micro light-emitting elements, the micro light-emitting elements are disposed on the growth substrate, and a surface of each of the micro light-emitting elements away from the growth substrate having at least one electrode; and melting the metal bonding pad at a heating temperature, and connecting the electrode to the metal bonding pad, and removing the growth substrate.

According to another embodiment of the present disclosure, a transfer carrier is adapted to be connected to an electrode of a micro light-emitting element and transfer the micro light-emitting element. A transfer carrier includes a transfer substrate and a plurality of metal bonding pads. The metal bonding pads are disposed on the transfer substrate, and every two metal bonding pads that are adjacent to each other are spaced apart from each other through a gap.

According to yet another embodiment of the present disclosure, a micro light-emitting element array includes a transfer carrier and a plurality of micro light-emitting elements. A transfer carrier includes a transfer substrate and at least one metal bonding pad. The metal bonding pad is disposed on the transfer substrate A surface of each of the micro light-emitting elements has at least one electrode. A connecting surface of the electrode and a lateral surface of the electrode are adjacent to each other. The metal bonding pad is connected to the connecting surface and a part of the lateral surface so as to fix the plurality of micro light-emitting elements on the transfer carrier.

BRIEF DESCRIPTION OF THE DRAWINGS

The present disclosure will become better understood from the detailed description given hereinbelow and the accompanying drawings which are given by way of illustration only and thus are not limitative of the present disclosure and wherein.

DETAILED DESCRIPTION

Figure 1:
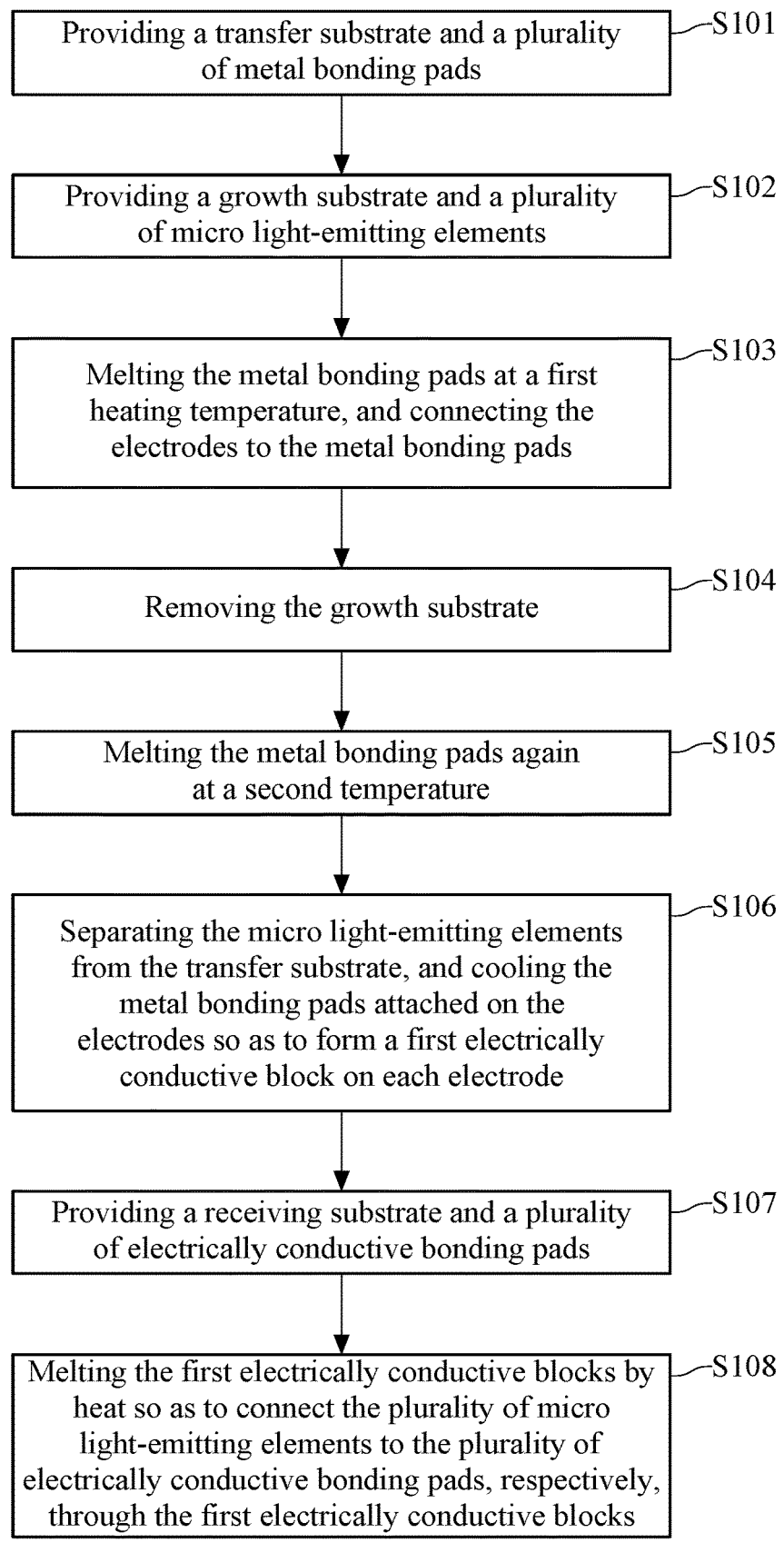
FIG. 1 is a flow chart of a method of manufacturing a micro light-emitting element array according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
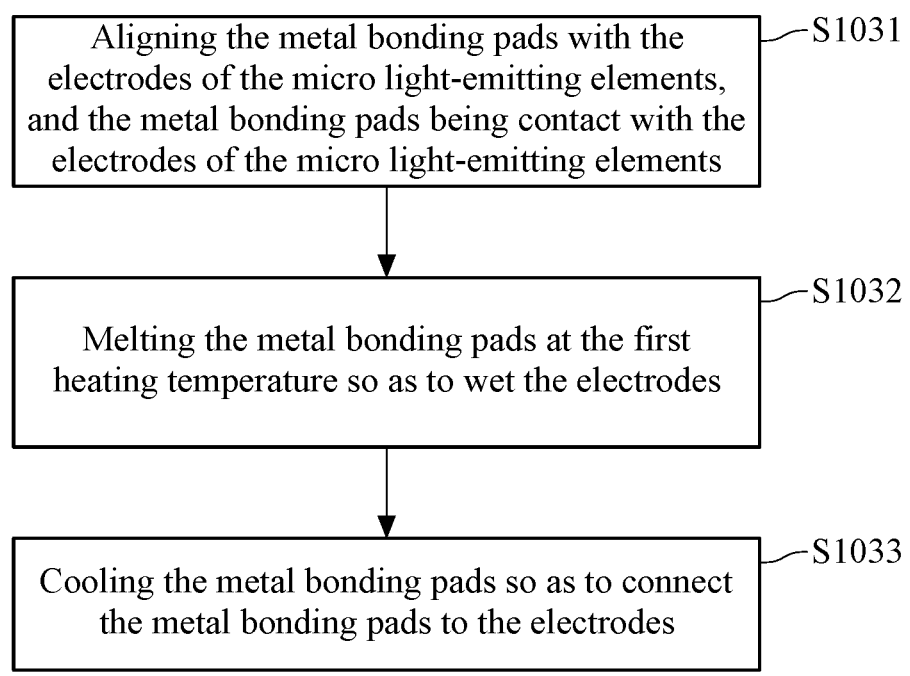
FIG. 2 is a flow chart of the step S103 in FIG. 1.
Figure 10:
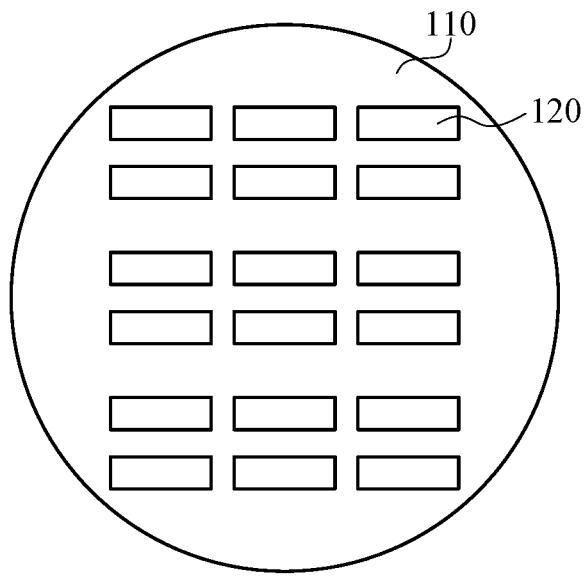
FIG. 10 to FIG. 12 are schematic views of three different types of metal bonding pad according to the present disclosure.
Figure 11:
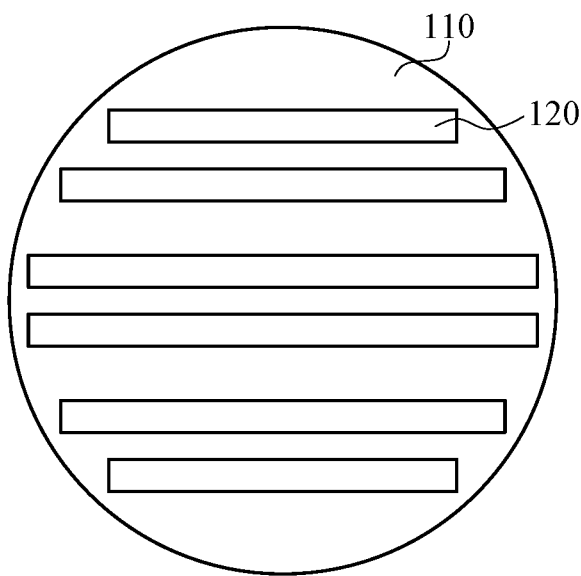
Figure 12:
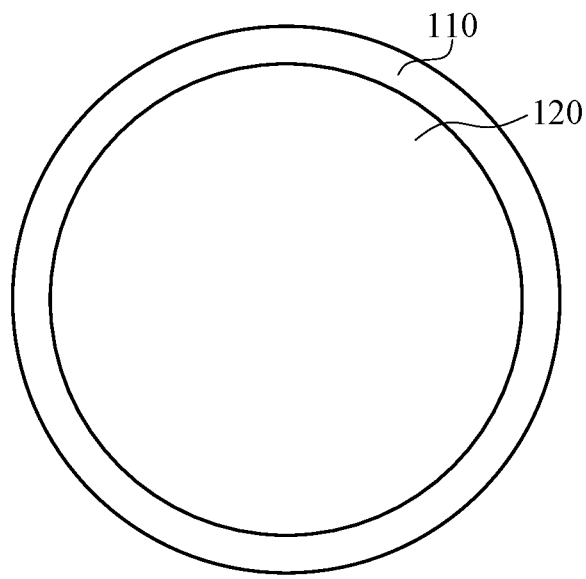

The first embodiment of the present disclosure provides a method of manufacturing a micro light-emitting element array and a display device. Please refer to FIG. 1 to FIG. 12. FIG. 1 is a flow chart of a method of manufacturing a micro light-emitting element array according to a first embodiment of the disclosure. FIG. 2 is a flow chart of the step S103 in FIG. 1. FIG. 3 to FIG. 9 are schematic view of the method in FIG. 1. FIG. 10 to FIG. 12 are schematic views of three different types of metal bonding pad according to the present disclosure. In this embodiment, a method of manufacturing a micro light-emitting element array includes steps S101 to S108.

In the step S101, a transfer substrate and a plurality of metal bonding pads are provided.

Figure 3:
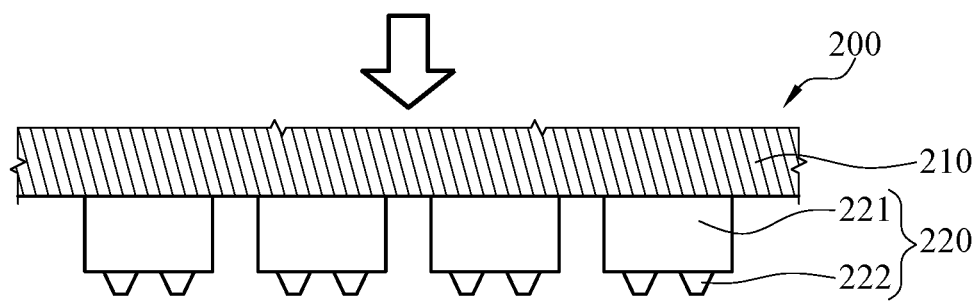
FIG. 3 to FIG. 9 are schematic view of the method in FIG. 1.

In detail, as shown in FIG. 3, a transfer carrier 100 is provided. The transfer carrier 100 includes a transfer substrate 110 and a plurality of metal bonding pads 120. The metal bonding pads 120 are disposed on the transfer substrate 110. In the first embodiment, the metal bonding pads 120 are arranged in an array arrangement (e.g., shown in FIG. 10), but the present disclosure is not limited thereto. In some other embodiments, each of the metal bonding pads is in bar shape (e.g., shown in FIG. 11). In addition, the quantity of the metal bonding pads 120 is not limited. In some embodiments, the metal bonding pad may be a single pad in plate shape (e.g., shown in FIG. 12). The metal bonding pad 120 is, for example, a metal bump that has a melting point smaller than 300° C. such as In, Sn, gold-tin alloy, copper or nano-metal composite material. Preferably, the melting point of the metal bonding pad 120 is smaller than 200° C. such that transferring the micro light-emitting element array does not require too high temperature, thereby increasing a manufacturing yield rate of the display device. In addition, the metal bonding pad helps the other elements to dissipate heat in the manufacturing process. The material of the transfer substrate 110 is, for example, $SiO_2$, Si, SiC, sapphire or $Al_2O_3$.

In the step S102, a growth substrate and a plurality of micro light-emitting elements are provided.

In detail, as shown in FIG. 3, a micro light-emitting element structure 200 is provided. The micro light-emitting element structure 200 includes a growth substrate 210 and a plurality of micro light-emitting elements 220. The micro light-emitting element 220 is, for example, a micro light-emitting diode (Micro LED). The micro light-emitting elements 220 are disposed on the growth substrate 210 in an array arrangement. A surface of each of the micro light-emitting elements 220 away from the growth substrate 210 has at least one electrode 222. More specifically, the micro light-emitting element 220 includes an epitaxial structure 221 and two electrodes 222. In the first embodiment, the micro light-emitting element 220 is a flip chip LED, and the two electrodes 222 are disposed on the surface of the epitaxial structure 221 away from the growth substrate 210. In some other embodiments, the micro light-emitting element is a vertical LED. The material of the electrode 222 is, for example, Au, Ag, Cu, Ge, Ni, Ti, Al or an alloy of the above metals. In the first embodiment, the material of the growth substrate 210 is, for example, $SiO_2$, Si, sapphire or $Al_2O_3$.

In the first embodiment, it is noted that the thickness of the metal bonding pad 120 is from 3 μm to 4 μm, but the present disclosure is not limited thereto. In some other embodiment, the thickness of the metal bonding pad 120 may be from 1 μm to 6 μm. If the thickness of the metal bonding pad is greater than 6 μm, the molten metal bonding pad 120 may enter between and be connected to the two electrodes 222 when the molten metal pad 120 being connected to the micro light-emitting element 220 so as to cause a short circuit. If the thickness of the metal bonding pad is smaller than 1 μm, the contact area between the molten metal bonding pad 120 and the micro light-emitting element 220 may be insufficient when the molten metal pad 120 being connected to the micro light-emitting element 220 so as to cause a connection strength between the molten metal bonding pad 120 and the micro light-emitting element 220 being weak.

The thickness of the epitaxial structure relates to a yield rate of the light-emitting element. In general, the thickness of the epitaxial structure is usually greater than 1 μm and preferably equal to 6 μm. A maximum width of the micro light-emitting element 220 is from 1 μm to 100 μm, preferably smaller than 30 μm. In the first embodiment, the maximum width of the micro light-emitting element 220 (e.g., Micro LED) is 1 μm. A peak value of the maximum current density of an external quantum efficiency curve of the micro light-emitting element 220 is from 0.01 $A/cm^2$ to 2 $A/cm^2$. That is, the micro light-emitting element is adapted to operate in a low current density.

In the step S103, the metal bonding pads are molten at a first heating temperature, and the electrodes of the micro light-emitting elements are connected to the metal bonding pads.

Figure 4:
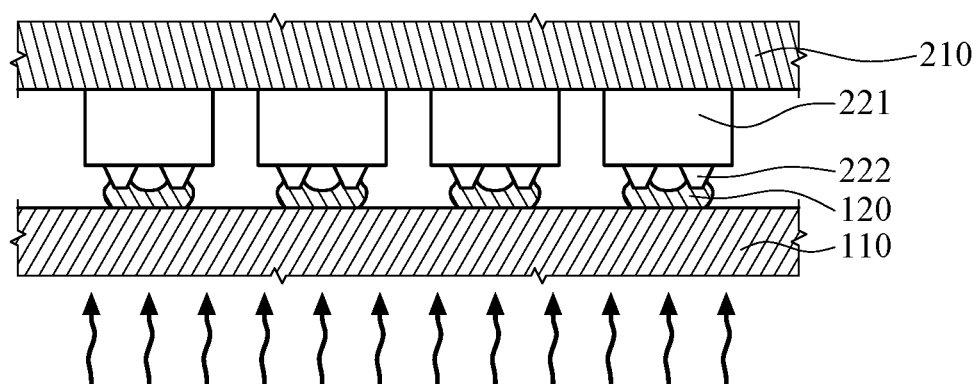

In detail, as shown in FIG. 2 and FIG. 4, the step S103 includes three sub-steps S1031, S1032 and S1033 which are described in the following paragraphs.

In the sub-step S1031, the metal bonding pads are aligned and in contact with the electrodes of the micro light-emitting elements. In detail, the two electrodes 222 of each micro light-emitting element 220 are aligned with one of the metal bonding pads 120, and then the two electrodes 222 are contact with the corresponding metal bonding pad 120. If a single metal bonding pad 120 in plate shape or bar shape is provided, the metal bonding pad 120 is contact with a plurality of electrodes 222 of the micro light-emitting elements 220 in the same time. In some embodiments, when the metal bonding pads 120 are arranged in an array arrangement, the two electrodes 222 of each micro light-emitting element 220 are contact with one of the metal bonding pads 120.

In the sub-step S1032, the metal bonding pads are molten at the first heating temperature, such that the electrodes of the micro light-emitting elements are wetted by the molten metal bonding pads. In detail, a melting point of the metal bonding pad 120 is smaller than a melting point of the electrode 222, and the first heating temperature is between the melting point of the metal bonding pad 120 and the melting point of the electrode 222. As such, when the metal bonding pad 120 on the transfer substrate 110 is heated at the first heating temperature, the metal bonding pad 120 is in a molten state, and the electrode 222 is still in a solid state. An intermolecular force between a molecule of the molten metal bonding pad 120 and a molecule of the electrode 222 is larger than an intermolecular force between molecules of the molten metal bonding pad 120 such that the molten metal bonding pad 120 wets the electrode 222. Because the metal bonding pad 120 has lower melting point, melting the metal bonding pad 120 does not require too high heating temperature, thereby decreasing the difficulty in the manufacturing process, and preventing the micro light-emitting element and other elements from broken. In the first embodiment, the metal bonding pad 120 is heated, for example, by laser.

In the sub-step S1033, the molten metal bonding pads are cooled down such that the metal bonding pads are connected to the electrodes. In detail, after the metal bonding pads 120 are stopped being heated, the metal bonding pads 120 are cooled and solidified. As such, each solidified metal bonding pad 120 is connected to the two electrodes 222 of each micro light-emitting element 220 so as to connect each micro light-emitting element 220 to the transfer substrate 110.

In the first embodiment, the first heating temperature is also smaller than a eutectic temperature of a eutectic bonding between the metal bonding pad 120 and the electrode 222. For example, the first heating temperature may be equal to either a peritectic temperature of a peritectic reaction between the metal bonding pad 120 and the electrode 222, the melting point of the metal bonding pad or a temperature slightly higher than the melting point of the metal bonding pad. The first heating temperature is smaller than the eutectic temperature. Therefore, in the first embodiment, a contact surface between the metal bonding pad 120 and the electrode 222 is in a non-wetting state. The connection between the metal bonding pad 120 and the electrode 222 is relied on a physical or chemical diffusion force instead of a bonding force produced by the eutectic bonding.

In the step S104, the growth substrate is removed.

Figure 5:
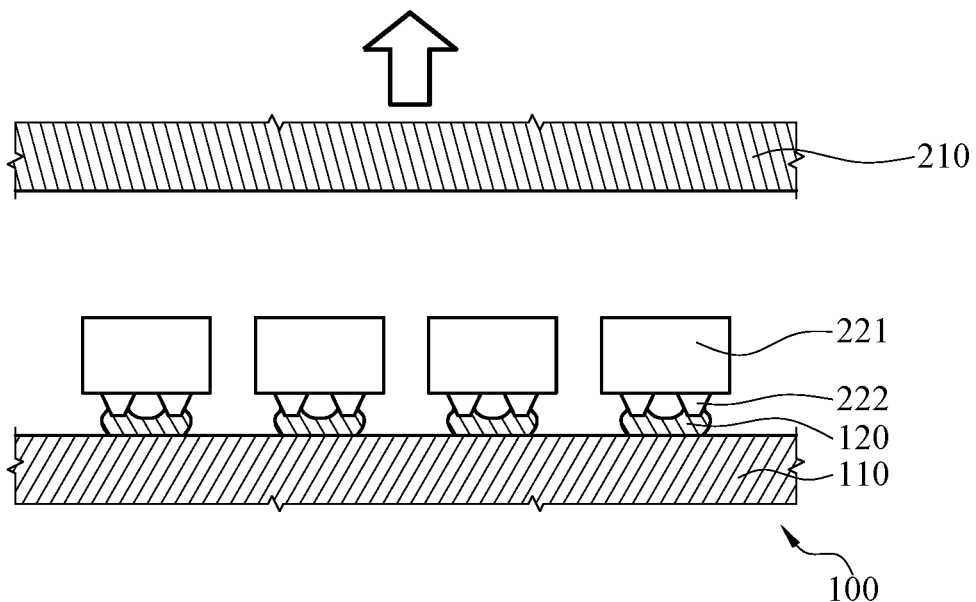

In detail, as shown in FIG. 5, the growth substrate 210 is removed from the micro light-emitting elements 220 through lift-off technology so as to obtain the micro light-emitting element array. The lift-off technology is, for example, the laser lift-off method.

Figure 6:
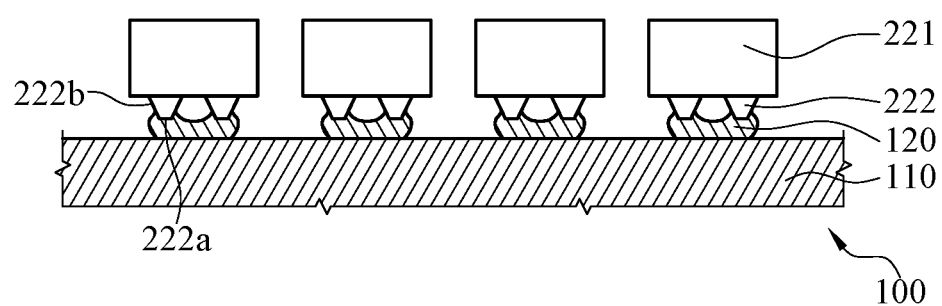

According to the aforementioned steps S101 to step S104, the micro light-emitting element array can be obtained. As shown in FIG. 6, the micro light-emitting element array includes the transfer carrier 100 and the plurality of micro light-emitting elements 220. The transfer carrier 100 includes the transfer substrate 110 and the metal bonding pads 120. The metal bonding pads 120 are disposed on a surface of the transfer substrate 110 in an array arrangement. The micro light-emitting elements 220 are disposed on the transfer carrier 100 in an array arrangement. The micro light-emitting element 220 includes the epitaxial structure 221 and two electrodes 222. The two electrodes 222 are disposed on a surface of the epitaxial structure 221 toward the transfer substrate 110. The micro light-emitting elements 220 are disposed on the transfer carrier 100 in an array arrangement through the metal bonding pads 120. In detail, the electrode 222 has a connecting surface 222a and a lateral surface 222b adjacent and connected to each other, and the connecting surface 222a faces on the transfer substrate 110. The metal bonding pad 120 is connected to the connecting surface 222a and a part of the lateral surface 222b of the electrode 222 so as to fix the micro light-emitting element 220 on the transfer carrier 100.

In the first embodiment, the ratio of an area of the lateral surface 222b covered by the metal bonding pad 120 to a surface area of the lateral surface 222b is greater than or equal to 0.05, and is smaller than or equal to 0.3. As such, the connection strength between the micro light-emitting element 220 and the transfer substrate 110 can be controlled so as to prevent the micro light-emitting element 220 from being difficultly removed from the transfer substrate 110 in the later process. Moreover, when the micro light-emitting element 220 is separated from the transfer substrate 110 in the later process, the amount of the metal bonding pad 120 attached on the electrode can be controlled by controlling the area of the lateral surface 222b covered by the metal bonding pad 120. As such, it is favorable for preventing two parts of the metal bonding pad 120 respectively attached on the two electrodes 222 of each micro light-emitting element 220 from contacting each other, thereby reducing short circuit problems.

Comparing the metal bonding pad 120 being glued on the electrode 222, when the metal bonding pad 120 is connected to the electrode 222 through a peritectic reaction or the diffusion force of the non-wetting state, the connection strength between the metal bonding pad 120 and the electrode 222 is much stronger. As such, during the transfer of the micro light-emitting elements 220, any unexpected shift in position of each micro light-emitting element 220 is prevented.

After removing the growth substrate to obtain the micro light-emitting element array, the micro light-emitting elements 220 of the micro light-emitting element array are able to be transferred to a receiving substrate 310 so as to be convenient for manufacturing a display device 400 including the receiving substrate 310 and the micro light-emitting elements 220. The method of transferring the micro light-emitting elements of the micro light-emitting element array to the receiving substrate is illustrated in the following paragraphs.

In the step S105, the metal bonding pads are molten again at a second heating temperature.

Figure 7:
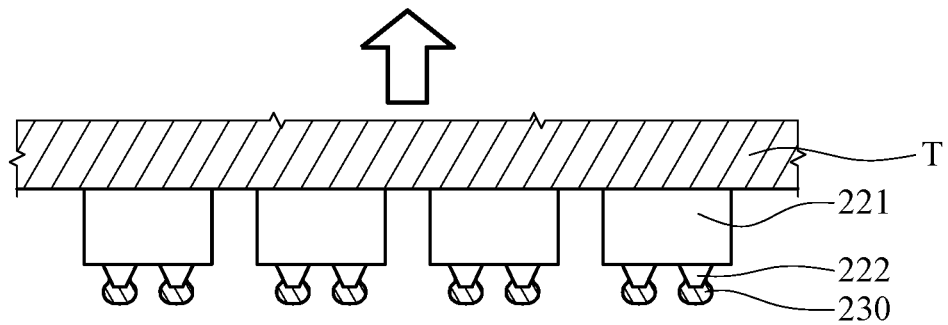
Figure 7:
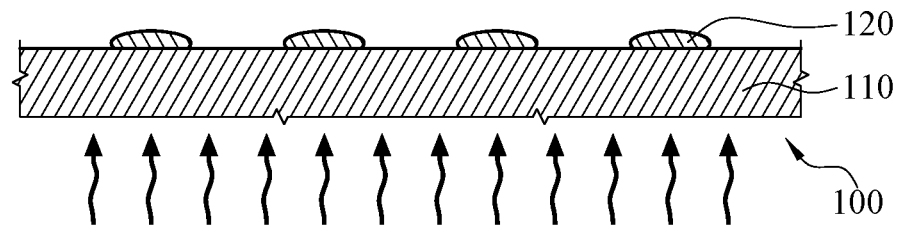

In detail, as shown in FIG. 7, the micro light-emitting elements 220 are fixed to a transferring device T, and then the metal bonding pads 120 on the transfer substrate 110 are heated again at the second heating temperature such that the metal bonding pads 120 are in the molten state, and the electrodes 222 are still in the solid state. As such, the connection force between the transfer substrate 110 and each the electrode 222 is removed. In the first embodiment, the metal bonding pads 120 are heated again by, for example, laser. The transferring device T includes, for example, a base (not shown in figures) and a holder (not shown in figures) which is disposed on the base, and the holder is configured to fix the positions of the micro light-emitting elements. The micro light-emitting elements are securely positioned on the holder through, for example, an adhesive force, a mechanical force, an electrostatic force or a negative pressure force produced by the transferring head. The second heating temperature is, for example, between the melting point of the metal bonding pad 120 and the melting point of the electrode 222, and the second heating temperature is smaller than the eutectic temperature of the eutectic bonding between the metal bonding pad 120 and the electrode 222. In the first embodiment, the second temperature in the step S105 may be equal to the first temperature in the step S103.

In the step S106, the micro light-emitting elements are separated from the transfer substrate, and a part of each molten metal bonding pad is attached on each electrode, and the metal bonding pads are cooled down so as to form a first conductive bump on each electrode.

In detail, as shown in FIG. 7, the transferring device T picks up the micro light-emitting elements 220 so as to separate the micro light-emitting elements 220 from the transfer substrate 110. Because the intermolecular force between the molecule of the molten metal bonding pad 120 and the molecule of the electrode 222 is larger than the intermolecular force between the molecules of the metal bonding pad 120, the molten metal bonding pad 120 is divided into at least two parts when the micro light-emitting element 220 separated from the transfer substrate 110. More specifically, a part of the molten metal bonding pad 120 is attached on the electrode 222, and the other part of the molten metal bonding pad 120 is remained on the transfer substrate 110. The part of the molten metal bonding pad 120 attached on the electrode 222 is gradually cooled down and solidified so as to form a first conductive bump 230 on the electrode 222.

In the first embodiment, the peritectic reaction and the non-wetting state between the metal bonding pad 120 and the electrode 222 are reversible. Therefore, in the process of transferring the micro light-emitting element 220 to the receiving substrate 310, the second heating temperature in removing the peritectic reaction or the non-wetting state is smaller than a heating temperature in removing the eutectic bonding, thereby preventing the micro light-emitting element 220 from being broken.

In the step S107, the receiving substrate and a plurality of conductive bonding pads are provided.

Figure 8:
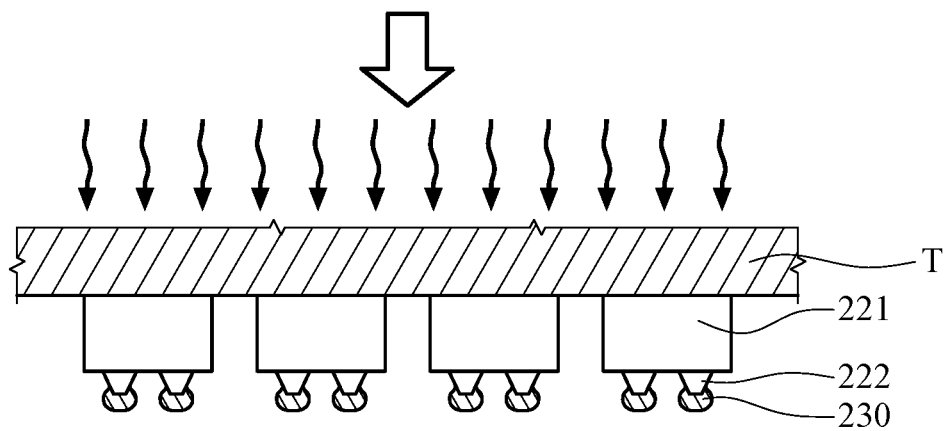
Figure 8:
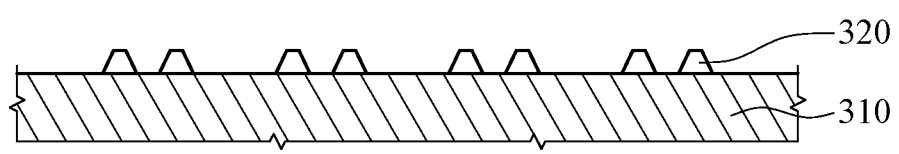

In detail, as shown in FIG. 8, the receiving substrate 310 includes a circuit pattern (not shown in figures). The conductive bonding pads 320 are disposed on the receiving substrate 310 in an array arrangement, and each of the conductive bonding pads 320 is interpreted as a junction where the micro light-emitting element 220 is connected to the circuit pattern. The receiving substrate 310 is, for example, a complementary metal-oxide-semiconductor substrate, a printed-circuit board, a liquid crystal on silicon substrate, a thin-film transistor substrate and so on. The material of the conductive bonding pad 320 is, for example, Ti, Pt, Au, Al, Ni, Cr or an alloy of above metal.

In the step S108, the first conductive bumps are molten by heat such that the first conductive bumps are respectively connected to the conductive bonding pads disposed on the receiving substrate.

In detail, as shown in FIG. 8, the first conductive bumps 230 are heated so as to be molten. Then, the electrodes 222 of the micro light-emitting elements 220 are respectively aligned with the conductive bonding pads 320, and the electrodes 222 are respectively connected to the conductive bonding pads 320 through the molten first conductive bumps 230. After the first conductive bumps 230 are cooled and solidified, the electrodes 222 are connected to the conductive bonding pads 320 through the first conductive bumps 230. In some other embodiments, the electrodes may be respectively contact with the conductive bonding pads at first, and then the first conductive bumps are heated so as to respectively connect the electrodes to the conductive bonding pads through the molten first conductive bumps.

Figure 9:
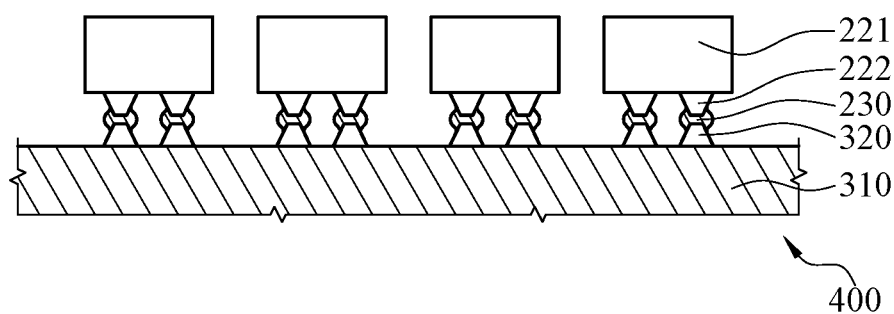

As shown in FIG. 9, when the micro light-emitting elements 220 are fixed on the receiving substrate 310, the transferring device T is detached from the micro light-emitting elements 220 so as to obtain the receiving substrate 310 including the micro light-emitting elements 220. The assembly of the receiving substrate 310 and the micro light-emitting elements 220 is applicable to the display device 400, which may be a micro LED display device, installed on a mobile device, a cellphone or a TV.

In the first embodiment, the temperature of the molten first conductive bump 230 is not only larger than a eutectic temperature between the first conductive bump 230 and the electrode 222, but also larger than a eutectic temperature between the first conductive bump 230 and the conductive bonding pad 320. Accordingly, the first conductive bump 230 and the conductive bonding pad 320 are in eutectic bonding, and the first conductive bump 230 and the electrode 222 are in eutectic bonding such that the micro light-emitting element 220 is firmly fixed on the receiving substrate 310.

In the first embodiment, before the micro light-emitting element 220 is connected to the conductive bonding pad 320, the peritectic reaction between the first conductive bump 230 and the electrode 222 produces delicate alloy grains inside or on a surface of the first conductive bump 230. When the first conductive bump 230 having the delicate alloy grains and the conductive bonding pad 320 are in the eutectic bonding, the delicate grains increase the connection quality between each other so as to provide a better connection strength or reduce the resistance between them.

Figure 13:
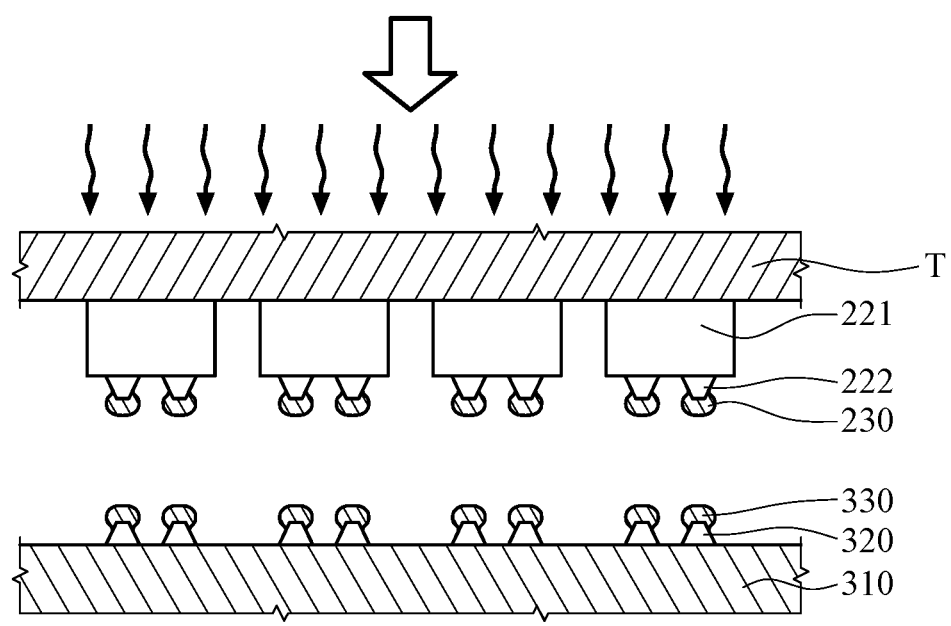
FIG. 13 is a schematic view of another type of the receiving substrate and the conductive bonding pad according to the present disclosure.

In the first embodiment, there is no any second conductive bump disposed on the surface of the conductive bonding pad 320, but the present disclosure is not limited thereto. In the first embodiment, there may be another type of the receiving substrate 310 and the conductive bonding pad 320. Please refer to FIG. 13. FIG. 13 is a schematic view of another type of the receiving substrate and the conductive bonding pad according to the present disclosure. As shown in FIG. 13, a surface of each of the conductive bonding pads 320 away from the receiving substrate 310 has a second conductive bump 330. The second conductive bump 330 and the first conductive bump 230 may be the same material. As such, the first conductive bump 230 and the second conductive bump 330 are interpreted as connecting materials between the electrode 222 of the micro light-emitting element 220 and the conductive bonding pad 320 of the receiving substrate 310. The first conductive bump 230 and the second conductive bump 330 are favorable for better connection quality.

In the first embodiment, when the transfer carrier 100 is separated from the micro light-emitting element 220, a part of the metal bonding pad 120 is attached on the micro light-emitting element 220. As such, the metal bonding pad 120 attached on the micro light-emitting element 220 can be taken as the first conductive bump 230 for connecting the micro light-emitting element 220 to the receiving substrate 310, thereby decreasing the frequency in disposing the bonding material and the cost of manufacturing the display device, and increasing the reliability of the display device.

Figure 14:
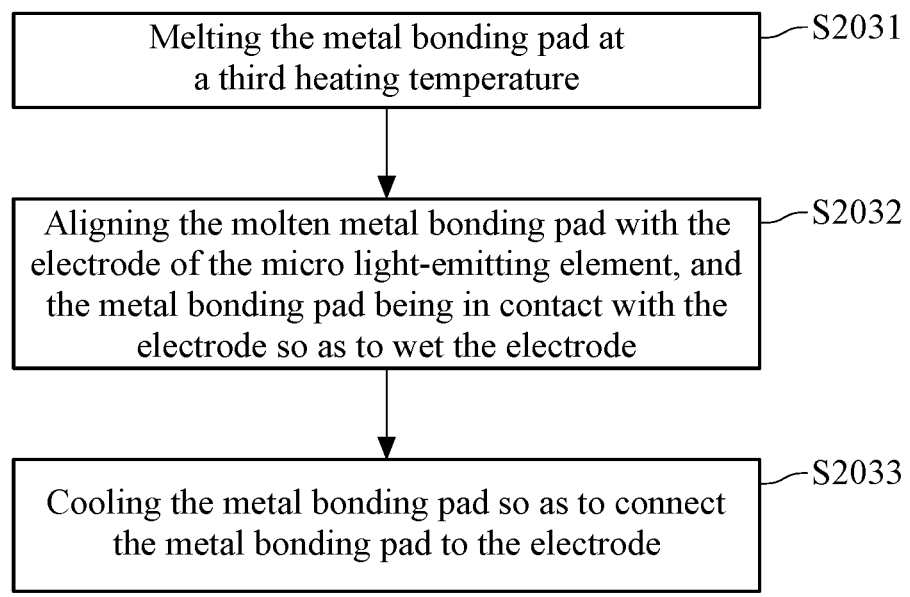
FIG. 14 is a flow chart of a step 103 of a method of manufacturing a micro light-emitting element array according to a second embodiment of the disclosure.
Figure 15:
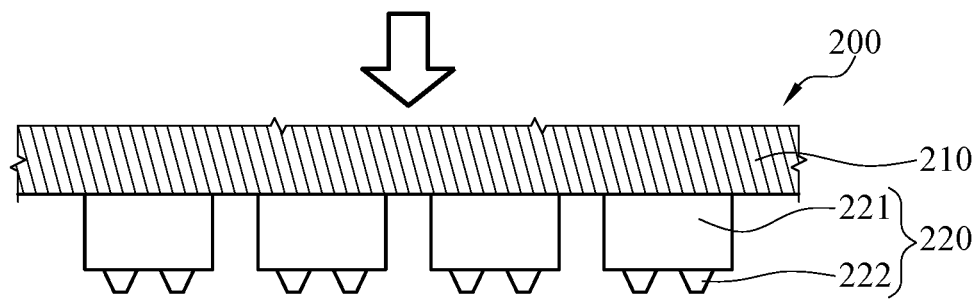
FIG. 15 is a schematic view of the step in FIG. 14.

The following paragraphs will illustrate a second embodiment of the disclosure. Please refer to FIG. 14 and FIG. 15. FIG. 14 is a flow chart of a step 103 of a method of manufacturing a micro light-emitting element array according to a second embodiment of the disclosure. FIG. 15 is a schematic view of the step in FIG. 14. The second embodiment is similar to the first embodiment, but the difference between the second embodiment and the first embodiment is in the sub-step of the step S103.

In the first embodiment, the step S103 includes melting the metal bonding pad at a first heating temperature, and connecting the electrode of the micro light-emitting element to the metal bonding pad. The step S103 includes the sub-step S1031, S1032 and S1033. The sub-step S1031 includes aligning the metal bonding pad with the electrode of the micro light-emitting element, and the metal bonding pad being in contact with the micro light-emitting element. The sub-step S1032 includes melting the metal bonding pad at the first heating temperature so as to wet the electrode by the molten metal bonding pad. The sub-step S1033 includes cooling the molten metal bonding pad so as to connect the metal bonding pad to the electrode.

In the second embodiment, a step includes sub-steps S2031, S2032 and S2033 which are respectively different from the sub-steps S1031, S1032 and S1033. The following paragraphs will illustrate the sub-steps S2031, S2032 and S2033.

In the sub-step S2031, a metal bonding pad is molten at a third heating temperature.

In detail, as shown FIG. 15, a melting point of the metal bonding pad 120 is smaller than a melting point of the electrode 222, and the third heating temperature is between the melting point of the metal bonding pad 120 and the melting point of the electrode 222. When the metal bonding pad 120 of a transfer substrate 110 is heated at the third heating temperature, the metal bonding pad 120 is in a molten state. The metal bonding pad 120 is heated by, for example, laser.

In the sub-step S2032, the molten metal bonding pad is aligned with the electrode of the micro light-emitting element, and the molten metal bonding pad is in contact with the electrode of the micro light-emitting element so as to wet the electrode.

In detail, the electrode 222 of each micro light-emitting element 220 is aimed to the molten metal bonding pad 120, and then the electrode 222 of each micro light-emitting element 220 is in contact with the metal bonding pad 120. If the metal bonding pad 120 is a single pad in plate shape or in bar shape, the metal bonding pad 120 is in contact with a plurality of electrodes 222 of the micro light-emitting elements 220 in the same time. If the metal bonding pad 120 is one of pads which are arranged in an array arrangement, the metal bonding pad 120 is only in contact with the electrode 222 of one micro light-emitting element 220. An intermolecular force between a molecule of the molten metal bonding pad 120 and a molecule of the electrode 222 is larger than an intermolecular force between molecules of the molten metal bonding pad 120 such that the molten metal bonding pad 120 wets the electrode 222 and attaches on the electrode 222.

In the step S2033, the molten metal bonding pad is cooled down so as to connect the metal bonding pad to the electrode.

In detail, after the metal bonding pad 120 is connected to the electrode 222, the molten metal bonding pad 120 is cooled down and solidified. As such, the solidified metal bonding pad 120 is connected to the electrode 222 so as to connect the micro light-emitting element 220 to the transfer substrate 110.

In the second embodiment, the requirement of the third heating temperature is similar to the requirement of the first heat temperature in the first embodiment, thus the following paragraphs will not further illustrate.

Figure 16:
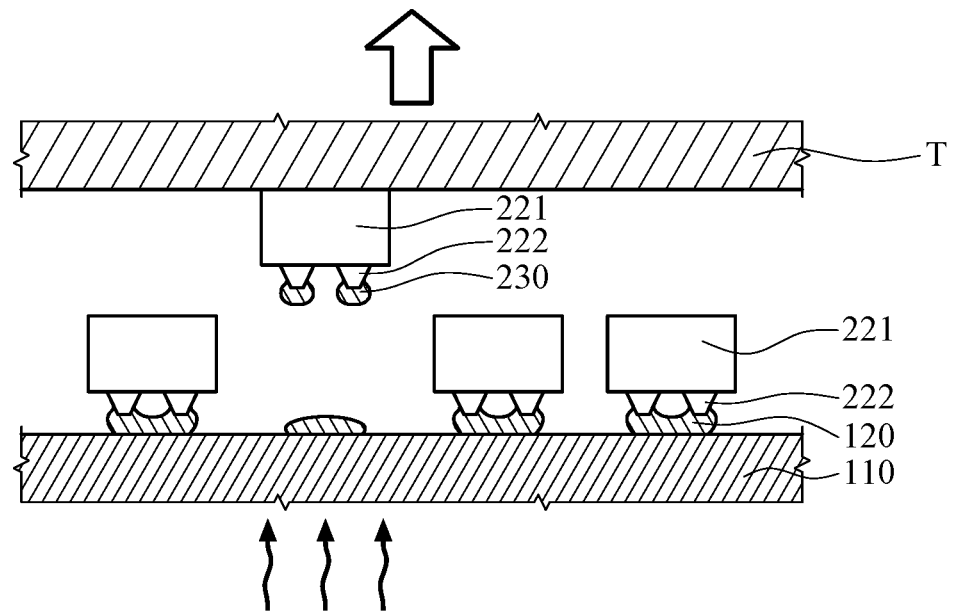
FIG. 16 and FIG. 17 are schematic views of the micro light-emitting element array according to the first embodiment of the disclosure when a part of the micro light-emitting element array is transferred.
Figure 17:
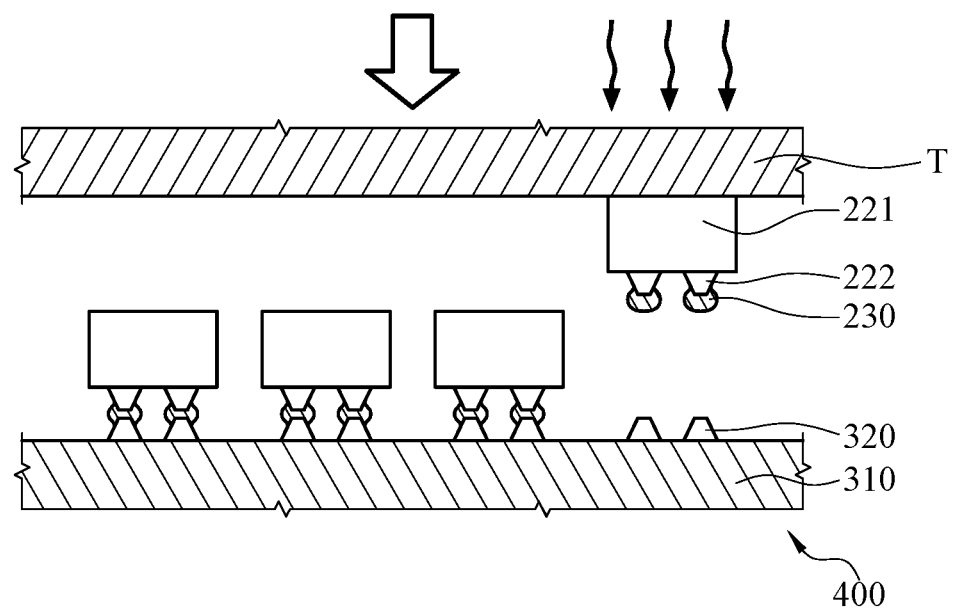

Then, the following paragraphs illustrate a micro light-emitting element array of the disclosure in an application of repairing a defective pixel of the display device. Please refer to FIG. 6, FIG. 16 and FIG. 17. FIG. 16 and FIG. 17 are schematic views of the micro light-emitting element array according to the first embodiment of the disclosure when a part of the micro light-emitting element array is transferred.

In a manufacturing process of the display device, the micro light-emitting element array on the receiving substrate 310 are required to be tested so as to ensure that each micro light-emitting element 220 can normally emit light. When a micro light-emitting element 220 is failed, it is necessary to replace the failed micro light-emitting element 220.

First, the failed micro light-emitting element (not shown in figures) is removed from the receiving substrate 310. Then, a specific area of the micro light-emitting element array shown in FIG. 6 is heated so as to melt the metal bonding pad 120. Then, the micro light-emitting element 220 in the specific area is picked up by the transferring device T. Then, the first conductive bump 230 on the electrode 222 of the micro light-emitting element 220 is molten by heat. Then, the micro light-emitting element 220 is connected to the conductive bonding pad 320, where the failed micro light-emitting element is removed from the receiving substrate 310 of the display device 400, through the molten first conductive bump 230. As such, in the micro light-emitting element array on the receiving substrate 310 of the display device 400, the failed micro light-emitting element is replaced with the new micro light-emitting element 220, thereby finishing the operation of repairing the defective pixel of the display device.

Figure 18:
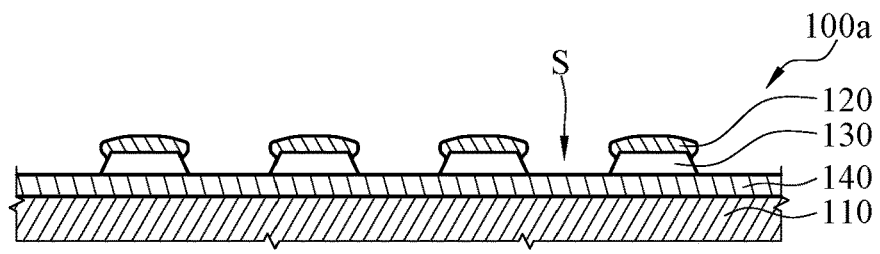
FIG. 18 is a cross-sectional view of a transfer carrier according to a third embodiment of the disclosure.
Figure 19:
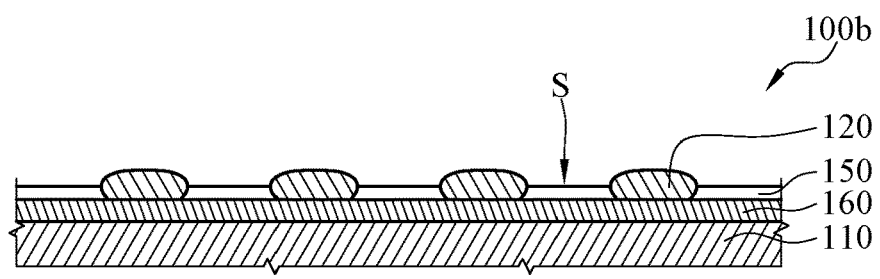
FIG. 19 is a cross-sectional view of a transfer carrier according to a fourth embodiment of the disclosure.
Figure 20:
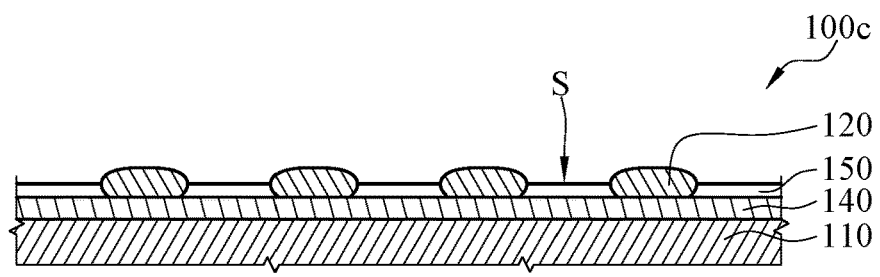
FIG. 20 is a cross-sectional view of a transfer carrier according to a fifth embodiment of the disclosure.
Figure 21:
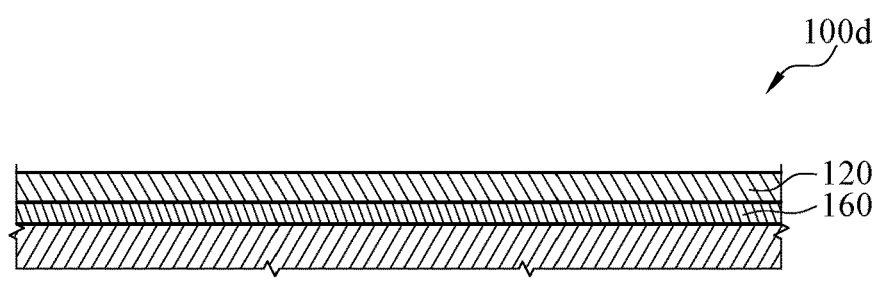
FIG. 21 is a cross-sectional view of a transfer carrier according to a sixth embodiment of the disclosure.

The following paragraphs will illustrate a transfer carrier of each of a third embodiment to a sixth embodiment. Please refer to FIG. 18 to FIG. 21. FIG. 18 is a cross-sectional view of a transfer carrier according to a third embodiment of the disclosure. FIG. 19 is a cross-sectional view of a transfer carrier according to a fourth embodiment of the disclosure. FIG. 20 is a cross-sectional view of a transfer carrier according to a fifth embodiment of the disclosure. FIG. 21 is a cross-sectional view of a transfer carrier according to a sixth embodiment of the disclosure.

A transfer carrier 100a of the third embodiment is applicable to vertical LED and horizontal LED. As shown in FIG. 18, the transfer carrier 100a includes a transfer substrate 110, a plurality of metal bonding pads 120, a plurality of under-bump metal structures 130 and a barrier layer 140. The barrier layer 140 is disposed on a surface of the transfer substrate 110. The under-bump metal structures 130 are disposed on a surface of the barrier layer 140 away from the transfer substrate 110 in an array arrangement, and every two of the under-bump metal structures 130 adjacent to each other are spaced apart through a gap S. The metal bonding pads 120 are respectively disposed on the under-bump metal structures 130, and every two of the metal bonding pads 120 adjacent to each other are also space apart through the gap S.

The under-bump metal structure 130 is wettable to the molten metal bonding pad 120. The barrier layer 140 is non-wettable to the molten metal bonding pad 120. As such, in the manufacturing process of the transfer carrier 100a, when the molten metal bonding pads 120 are disposed on the under-bump metal structure 130, the molten metal bonding pads 120 tend to be attached on the under-bump metal structure 130 instead of the barrier layer 140. Therefore, after each of the metal bonding pads 120 is cooled and solidified, the metal bonding pad 120 is in a ball shape and will not flow on the barrier layer 140, so as to prevent the two adjacent metal bonding pads 120 from being connected to each other.

In the transfer carrier 100a of the third embodiment, the material of the under-bump metal structure 130 is, for example, Ti, Pt, Au, Al, Ni, Cr or an alloy of above metal. The material of the barrier layer 140 is, for example, $SiO_2$, SiNx or another macromolecule material.

A transfer carrier 100b of the fourth embodiment is applicable to vertical LED and horizontal LED. As shown in FIG. 19, the transfer carrier 100b includes a transfer substrate 110, a plurality of metal bonding pads 120, a partitioning material 150 and a wetting layer 160. The wetting layer 160 is disposed on a surface of the transfer substrate 110. The metal bonding pad 120 is disposed on a surface of the wetting layer 160, and every two of the metal bonding pads 120 adjacent to each other are spaced apart through a gap S. The partitioning material 150 is filled in the bottom of the gap S so as to separate two adjacent metal bonding pads 120 from each other through the partitioning material 150 and the gap S.

The partitioning material 150 is non-wettable to the molten metal bonding pad 120. The wetting layer 160 is wettable to the molten metal bonding pad 120. As such, in the manufacturing process of the transfer carrier 100b, when the molten metal bonding pads 120 are disposed on the wetting layer 160, the two adjacent molten metal bonding pads 120 are separated by the partitioning material 150, and the molten metal bonding pads 120 tend to be attached on the wetting layer 160 instead of the partitioning material 150. Therefore, each of the metal bonding pads 120 after being cooled and solidified is in a ball shape, and will not flow on the partitioning material 150 so as to prevent the two adjacent metal bonding pads 120 from being connected to each other.

In the transfer carrier 100b of the third embodiment, the material of the wetting layer 160 is, for example, Ti, Pt, Au, Al, Ni, Cr or the alloy of above material. The material of the partitioning material 150 is, for example, $SiO_2$, SiNx or another macromolecule material.

A transfer carrier 100c of the fifth embodiment is applicable to vertical LED and horizontal LED. As shown in FIG. 20, the transfer carrier 100c includes a transfer substrate 110, a plurality of metal bonding pads 120, a barrier layer 140 and a partitioning material 150. The barrier layer 140 is disposed on a surface of the transfer substrate 110. The metal bonding pads 120 is disposed on a surface of the barrier layer 140, and every two of the metal bonding pads 120 adjacent to each other are spaced apart through a gap S. The partitioning material 150 is filled in the bottom of the gap S so as to separate two adjacent metal bonding pads 120 from each other through the partitioning material 150 and the gap S.

The barrier layer 140 is wettable to the molten metal bonding pad 120. The partitioning material 150 is non-wettable to the molten metal bonding pad 120. As, such, in the manufacturing process of the transfer carrier 100c, when the molten metal bonding pads 120 are disposed on the barrier layer 140, the two adjacent molten metal bonding pads 120 are separated by the partitioning material 150, and the molten metal bonding pads 120 are uneasily attached on the barrier layer 140 and the partitioning material 150, such that each of the molten metal bonding pads 120 tends to gather in a position where it stays. Therefore, after the metal bonding pads 120 are cooled and solidified, the metal bonding pad 120 is in ball shape and will not flow on the partitioning material 150, so as to prevent the two adjacent metal bonding pad 120 from connecting to each other.

In the transfer carrier 100c of the fifth embodiment, the material of the barrier layer 140 is, for example, SiNx, $SiO_2$, or other another macromolecule material. The material of the partitioning material 150 is, for example, SiNx, $SiO_2$ or another macromolecule material.

In the process of connecting the electrode 222 of the micro light-emitting element 220 to the metal bonding pad 120 of the transfer carrier 100a, 100b or 100c, the molten metal bonding pad 120 pushed by the electrode 222 is uneasily attached and uneasily flow on the barrier layer 140 so as to prevent the molten metal bonding pad 120 from being connected to the adjacent molten metal bonding pad 120 or the adjacent electrode 222. As such, using the transfer carrier 100a, 100b or 100c in manufacturing the micro light-emitting element array can prevent two adjacent electrodes of the horizontal micro light-emitting element, located on the same side of the epitaxial structure and having smaller gap therebetween, or two adjacent electrodes of the vertical micro light-emitting element, located on two opposite sides of the epitaxial structure and having larger gap therebetween, from connecting to each other through the metal bonding pad and causing the short circuit.

The transfer carrier 100d of the sixth embodiment is applicable to vertical LED and horizontal LED. As shown in FIG. 21, the transfer carrier 100d includes a transfer substrate 110, a metal bonding pad 120 and a wetting layer 160. The wetting layer 160 is disposed on a surface of the transfer substrate 110. The metal bonding pad 120 is disposed on a surface of the wetting layer 160. The wetting layer 160 is wettable to the molten metal bonding pad 120.

In the sixth embodiment, the material of the wetting layer 160 is, for example, Ti, Pt, Au, Al, Ni, Cr or an alloy of above metal.

According to the method of manufacturing the micro light-emitting element array, the transfer carrier and the micro light-emitting element array as discussed above, when the transfer carrier is separated from the micro light-emitting element, a part of the metal bonding pad is attached on the micro light-emitting element. As such, the metal bonding pad attached on the micro light-emitting element can be taken as the first conductive bump for connecting the micro light-emitting element to the receiving substrate, thereby decreasing the frequency in disposing the bonding material and the cost of manufacturing the display device, and increasing the reliability of the display device.

What is claimed is:

1. A transfer carrier, adapted to be connected to an electrode of a micro light-emitting element and transfer the micro light-emitting element, comprising:
   a transfer substrate;
   a plurality of metal bonding pads disposed on the transfer substrate, and every two of the plurality of metal bonding pads that are adjacent to each other being spaced apart from each other through a gap;
   a plurality of under-bump metal structures respectively located between the transfer substrate and the plurality of metal bonding pads, wherein the plurality of under-bump metal structures are wettable to the plurality of metal bonding pads which are molten; and
   a barrier layer located between the plurality of under-bump metal structures and the transfer substrate, wherein the barrier layer is non-wettable to the plurality of metal bonding pads which are molten, and part of the barrier layer overlaps the gap; each of the under-bump metal structures has a top surface facing away from the transfer substrate and a side surface connecting the top surface with the barrier layer; the top surface and a top part of the side surface are wrapped by a corresponding metal bonding pad.

2. The transfer carrier according to claim 1, wherein each of the plurality of under-bump metal structures is made of Ti, Pt, Au, Al, Ni, Cr or alloy thereof, and the barrier layer is made of SiNx or $SiO_2$.

3. The transfer carrier according to claim 1, wherein a surface of the barrier layer exposes to outside.

4. The transfer carrier according to claim 1, wherein the barrier layer has a larger area than the plurality of under-bump metal structures.

5. The transfer carrier according to claim 1, wherein the bather layer extends through a region where the gap exists.

6. A transfer carrier, adapted to be connected to an electrode of a micro light-emitting element and transfer the micro light-emitting element, comprising:
   a transfer substrate;
   a plurality of metal bonding pads disposed on the transfer substrate, and every two of the plurality of metal bonding pads that are adjacent to each other being spaced apart from each other through a gap;
   a partitioning material filled in the gap, wherein the partitioning material is non-wettable to the plurality of metal bonding pads which are molten; and
   a wetting layer located between the transfer substrate and the plurality of metal bonding pads, wherein the wetting layer is located between the transfer substrate and the partitioning material, and the wetting layer is wettable to the plurality of metal bonding pads which are molten.

\* \* \* \* \*